US010069531B2

(12) United States Patent
Koch et al.

(10) Patent No.: US 10,069,531 B2
(45) Date of Patent: Sep. 4, 2018

(54) BALANCING SENSE AMPLIFIER FOR ETHERNET TRANSCEIVER

(71) Applicant: Analog Devices Global, Hamilton (BM)

(72) Inventors: Andreas Koch, Wiesbaden (DE); Ralph Patrick McCormick, Haverhill, MA (US)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/289,614

(22) Filed: Oct. 10, 2016

(65) Prior Publication Data
US 2017/0111081 A1 Apr. 20, 2017

Related U.S. Application Data

(60) Provisional application No. 62/244,055, filed on Oct. 20, 2015, provisional application No. 62/244,047, filed on Oct. 20, 2015.

(51) Int. Cl.
*H04B 3/30* (2006.01)
*H04B 1/56* (2006.01)
*G11C 7/06* (2006.01)

(52) U.S. Cl.
CPC .............. *H04B 1/56* (2013.01); *G11C 7/062* (2013.01); *H04B 3/30* (2013.01)

(58) Field of Classification Search
CPC ... H04B 3/30; H04L 25/0272; H04L 25/0274; H04L 25/0292
See application file for complete search history.

(56) References Cited

U.S. PATENT DOCUMENTS

| 4,393,494 A | 7/1983 | Belforte et al. |
| 5,822,426 A | 10/1998 | Rasmus |
| 6,560,290 B2 | 5/2003 | Ahn et al. |
| (Continued) | | |

FOREIGN PATENT DOCUMENTS

| DE | 3312641 A1 | 12/1983 |
| WO | 2017069963 | 4/2017 |

OTHER PUBLICATIONS

"International Application Serial No. PCT/US2016/056279, International Search Report dated Dec. 21, 2016", 4 pgs.
(Continued)

*Primary Examiner* — David S Huang
(74) *Attorney, Agent, or Firm* — Schwegman Lundberg & Woessner, P.A.

(57) ABSTRACT

An Ethernet or other communications module can amplify and reinforce a signal received from a non-local source without requiring a transformer or other magnetic component. A semiconductor integrated difference amplifier circuit can be used to amplify and reinforce a differential mode component of the received signal, while also attenuating a common mode component of the received signal. A transmission compensation network can generate a phase-shifted version of a locally transmitted signal being placed on the same communication terminals as the received signal during full duplex communications, for cancellation of such locally transmitted signal at inputs of a local receiver circuit. This can enhance detection of the received signal generated by the non-local source.

20 Claims, 2 Drawing Sheets

(56) References Cited

U.S. PATENT DOCUMENTS

| | | |
|---|---|---|
| 7,113,759 B2 | 9/2006 | Jordanger et al. |
| 2002/0159548 A1 | 10/2002 | Evans et al. |
| 2003/0206579 A1* | 11/2003 | Bryant .................. H03G 7/007 |
| | | 375/219 |
| 2005/0053227 A1 | 3/2005 | Fortier |
| 2007/0260904 A1* | 11/2007 | Camagna ................ H04L 12/10 |
| | | 713/310 |

OTHER PUBLICATIONS

"International Application Serial No. PCT/US2016/056279, Written Opinion dated Dec. 21, 2016", 5 pgs.
"International Application Serial No. PCT US2016 056279, International Preliminary Report on Patentability dated May 3, 2018", 7 pgs.

* cited by examiner

BALANCING SENSE AMPLIFIER FOR ETHERNET TRANSCEIVER

CLAIM OF PRIORITY

This patent application claims the benefit of priority of U.S. Provisional Patent Application Ser. No. 62/244,055, entitled TRANSCEIVER FRONTEND FOR ETHERNET WITH TRANSFORMERLESS BALANCING CIRCUIT, filed on Oct. 20, 2015, and U.S. Provisional Patent Application Ser. No. 62/244,047, entitled ACTIVE BALANCING CIRCUIT, filed on Oct. 20, 2015, which are hereby incorporated by reference in their entirety.

TECHNICAL FIELD

This document pertains generally, but not by way of limitation, to circuits and systems involving difference amplification, such as a transceiver front-end circuit for Ethernet or other communications.

BACKGROUND

The Ethernet physical layer is an example of a high frequency communications network physical layer in which the physical medium over which one or more electrical signals can be communicated can include an Ethernet cable with one or more communication lines that can include one or more respective twisted pairs of wires. Ethernet communication can encode data as differential signals on these communication lines for high frequency communication, for example, at 125 MHz. Full duplex data communication over the physical medium means that an incoming received signal may be present on a pair of wires at the same time that an outgoing transmitted signal is present on that same pair of wires. Parasitic capacitance and other non-idealities of the Ethernet cable can result in the differential data signal being accompanied or overwhelmed by a common-mode signal.

At a particular communications network node, a received digital signal should be quickly amplified from a small differential signal present on the pair of wires to a larger differential signal that can provide suitable signal levels for differentially or single-endedly driving logic or other circuits within a receiver circuit at that particular network node. Such small differential signals present on the pair of wires should be detected even in the presence of a common mode signal that may be present on the pair of wires, such as may be due to circuit or environmental noise or differences between receiving and transmitting locations.

To achieve both differential signal amplification and common mode signal attenuation, a center tap auto-transformer balancing circuit can be used at an Ethernet network node, such to provide a high input impedance for the differential data signal, for its amplification, and a low input impedance for the common mode signal, for its attenuation.

SUMMARY

The present inventors have recognized, among other things, that a magnetic autotransformer balancing circuit can be bulky, unreliable, difficult to manufacture, and expensive and can impose poor frequency response, magnetically susceptibility, temperature-sensitivity, and other limitations on transceiving signals at an Ethernet network node or in another communications application. This document describes a transformerless transceiver front-end circuit, such as can be used for Ethernet or other applications. Thus, the present transceiver front-end can be implemented and fully integrated using one or more standard CMOS or other semiconductor integrated circuits, without requiring a magnetic component such as a bulky and expensive autotransformer to remove or attenuate a common mode signal component on the Ethernet communication lines. Line impedance of the Ethernet communication lines can be matched to avoid reflections and electromagnetic radiation to meet electromagnetic interference (EMI) and electromagnetic compatibility (EMC) requirements. The locally transmitted signal placed on the Ethernet communication lines can be compensated or cancelled from the locally received signal, thereby allowing and enhancing full duplex communications over the Ethernet communications lines.

An Ethernet or other communications module can amplify and reinforce a signal received from a non-local source without requiring a transformer or other magnetic component. A semiconductor integrated difference amplifier circuit can be used to provide high differential mode input impedance to amplify and reinforce a differential mode component of the received signal, while also providing low common mode input impedance to attenuate a common mode component of the received signal. A transmission compensation network can generate a phase-shifted version of a locally transmitted signal being placed on the same communication terminals as the received signal during full duplex communications, for cancellation of such locally transmitted signal at inputs of a local receiver circuit. This can enhance detection of the received signal generated by the non-local source.

An overview of certain non-limiting aspects of the present subject matter is provided below.

Aspect 1 can include or use subject matter (e.g., device, apparatus, system, method, machine readable medium with instructions to perform a method, etc.) that can include or use a circuit. The circuit can comprise first and second I/O connection terminals. The circuit can also comprise a semiconductor integrated difference signal sense amplifier circuit, which can have inputs respectively coupled to the first and second connection terminals, and sense amplifier circuit outputs, the sense amplifier circuit including first and second amplifiers that can be configured to include: a differential mode high relative input impedance such as to actively amplify and reinforce a differential signal received at the communication connection terminals without requiring a transformer or other magnetic component; and a common mode low relative input impedance such as to actively pull the common mode signal voltage at the first and second connection terminals toward a desired value, wherein the common mode relative low input impedance is low relative to the differential mode high relative input impedance.

Aspect 2 can include or use subject matter as in Aspect 1, which can optionally be included or used in a communications transceiver circuit which can further include: a receiver circuit, which can include receiver circuit inputs coupled to the sense amplifier circuit outputs; a transmitter circuit, which can include transmitter circuit outputs respectively coupled to the first and second connection terminals; and a transmission compensation network, which can be coupled to the transmitter circuit and the receiver circuit, and which can be configured to phase shift a transmitted signal at the transmitter circuit outputs for presentation at the receiver circuit inputs of the receiver circuit to attenuate or remove the transmitted signal at the receiver circuit inputs of the receiver circuit.

Aspect 3 can include or use subject matter as any of Aspects 1 and 2, and can optionally include or use the sense amplifier circuit including: a first amplifier circuit that can include a non-inverting input biased at a specified signal value, an inverting input that can be coupled to the second connection terminal, and an output that can be coupled to a non-inverting input of the receiver circuit and to the first connection terminal; and a second amplifier circuit that can include a non-inverting input that can be biased at the specified signal value, an inverting input that can be coupled to the first connection terminal, and an output that can be coupled to the inverting input of the receiver circuit and to the second connection terminal.

Aspect 4 can include or use subject matter as any of Aspects 1-3, and can optionally include or use the transmission compensation network that can include first and second resistors in series with each other between an inverting output of the transmitter circuit and a non-inverting input of the receiver circuit; third and fourth resistors in series with each other between a non-inverting output of the transmitter circuit and an inverting input of the receiver circuit; and a capacitor having a first terminal connected to a node between the first and second resistors and having a second terminal connected to a node between the third and fourth resistors.

Aspect 5 can include or use subject matter as any of Aspects 1-4, and can optionally include or use the resistance values of the first, second, third, and fourth resistors and the capacitance value of the capacitor that can be selected to provide a nominal 180 degree phase shift at a specified data transmission frequency of the transmitter circuit.

Aspect 6 can include or use subject matter as any of Aspects 1-5, and can optionally include or use the sense amplifier circuit that can include: a first shunt resistor, between the output of the first amplifier circuit and the first connection terminal; and a second shunt resistor, between the output of the second amplifier circuit and the second connection terminal.

Aspect 7 can include or use subject matter as any of Aspects 1-6, and can optionally include or use the sense amplifier circuit that can include: a first input resistor, such as coupling the inverting input of the first amplifier circuit to the second connection terminal; a second input resistor, such as coupling the inverting input of the second amplifier circuit to the first connection terminal; a first feedback resistor, such as coupling the output of the first amplifier circuit to the inverting input of the first amplifier; and a second feedback resistor, such as coupling the output of the second amplifier circuit to the inverting input of the second amplifier.

Aspect 8 can include or use subject matter as any of Aspects 1-7, and can optionally include or use a first termination resistor, such as coupling the first connection terminal to the non-inverting output of the transmitter circuit; and a second termination resistor, such as coupling the second connection terminal to the inverting output of the transmitter circuit.

Aspect 9 can include or use subject matter as any of Aspects 1-8, and can optionally include or use: a first decoupling resistor, coupled between the output of the first amplifier circuit and the non-inverting input of the receiver circuit; and a second decoupling resistor, coupled between the output of the second amplifier circuit and the inverting input of the receiver circuit.

Aspect 10 can include or use subject matter as any of Aspects 1-9, and can optionally additionally or alternatively include or use a method of using a circuit, the method can comprise: using a semiconductor integrated difference signal amplifier circuit providing differential mode high relative input impedance, actively amplifying and reinforcing a differential signal received at first and second connection terminals without requiring a transformer or other magnetic component; and using the semiconductor integrated difference signal amplifier circuit, also providing common mode low relative input impedance for actively pulling the common mode signal voltage at the first and second communication connection terminals toward a desired value, wherein the common mode relative low input impedance is low relative to the differential mode high relative input impedance.

Aspect 11 can include or use subject matter as any of Aspects 1-10, and can optionally include or use: phase-shifting a locally transmitted signal produced by a local transmitter circuit by 180 degrees at a specified data transmission frequency of the local transmitter circuit; and applying the phase-shifted locally transmitted signal to a local receiver circuit to attenuate or cancel the locally transmitted signal to enhance detection of a signal received at the first and second connection terminals from a non-local transmitter.

Aspect 12 can include or use subject matter as any of Aspects 1-11, and can optionally include or use: resistively decoupling the first and second amplifier outputs from the local receiver circuit.

Aspect 13 can include or use subject matter as any of Aspects 1-12, and can optionally include or use: using a first amplifier to sense a voltage increase at the second communication connection terminal and, in response, drive a voltage decrease at the first communication connection terminal; and using a second amplifier to sense a voltage decrease at the first communication connection terminal and, in response, drive a voltage increase and the second communication connection terminal.

Aspect 14 can include or use subject matter as any of Aspects 1-13, and can optionally include or use: using the first amplifier to sense a voltage decrease at the second connection terminal and, in response, drive a voltage increase at the first connection terminal; and using the second amplifier to sense a voltage increase at the first connection terminal and, in response, drive a voltage decrease at the second connection terminal.

Aspect 15 can include or use subject matter as any of Aspects 1-14, and can optionally include or use: sensing a voltage increase at the second connection terminal using the first amplifier together with sensing a voltage increase at the first connection terminal using the second amplifier and, in response, using the first and second amplifiers to actively increase a shunt current away from the first and second connection terminals to actively decrease the voltage at the first and second connection terminals.

Aspect 16 can include or use subject matter as any of Aspects 1-15, and can optionally include or use: sensing a voltage decrease at the second connection terminal using the first amplifier together with sensing a voltage decrease at the first connection terminal using the second amplifier and, in response, using the first and second amplifiers to actively decrease a shunt current away from the first and second connection terminals to actively increase the voltage at the first and second connection terminals.

Aspect 17 can include or use subject matter as any of Aspects 1-16, and can optionally include or use: actively increasing a shunt current away from the first and second connection terminals includes using an output voltage of the first amplifier to drive a first shunt resistor between the output of the first amplifier and the first connection terminal and using an output voltage of the second amplifier to drive a second shunt resistor between the output of the second amplifier and the second connection terminal.

Aspect 18 can include or use subject matter as any of Aspects 1-17, and can optionally additionally or alternatively include or use: a communications transceiver circuit, which can comprise: first and second communication connection terminals; and a semiconductor integrated difference signal sense amplifier circuit, having inputs respectively coupled to the first and second communication connection terminals, and sense amplifier circuit outputs, the sense amplifier circuit including first and second amplifiers configured to include: a differential mode high relative input impedance to actively amplify and reinforce a differential signal received at the communication connection terminals without requiring a transformer or other magnetic component; and a common mode low relative input impedance to actively pull the common mode signal voltage at the first and second connection terminals toward a desired value, wherein the common mode relative low input impedance is low relative to the differential mode high relative input impedance; a receiver circuit, including receiver circuit inputs coupled to the sense amplifier circuit outputs; a transmitter circuit, including transmitter circuit outputs respectively coupled to the first and second communication connection terminals; and a transmission compensation network, coupled to the transmitter circuit and the receiver circuit, and configured to phase shift a transmitted signal at the transmitter circuit outputs for presentation at the receiver circuit inputs of the receiver circuit to attenuate or remove the transmitted signal at the receiver circuit inputs of the receiver circuit; and wherein the sense amplifier circuit includes: a first amplifier circuit including a non-inverting input biased at a specified signal value, an inverting input coupled to the second communication connection terminal, and an output coupled to a non-inverting input of the receiver circuit and to the first communication connection terminal; and a second amplifier circuit including a non-inverting input biased at the specified signal value, an inverting input coupled to the first communication connection terminal, and an output coupled to the inverting input of the receiver circuit and to the second communication connection terminal.

Aspect 19 can include or use subject matter as any of Aspects 1-18, and can optionally include or use: the sense amplifier circuit being configured for sensing a voltage increase at the second connection terminal using the first amplifier together with sensing a voltage increase at the first connection terminal using the second amplifier and, in response, using the first and second amplifiers to actively increase a shunt current away from the first and second connection terminals to actively decrease the voltage at the first and second connection terminals.

Aspect 20 can include or use subject matter as any of Aspects 1-19, and can optionally include or use: the sense amplifier is configured for sensing a voltage decrease at the second connection terminal using the first amplifier together with sensing a voltage decrease at the first connection terminal using the second amplifier and, in response, using the first and second amplifiers to actively decrease a shunt current away from the first and second connection terminals to actively increase the voltage at the first and second connection terminals.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

An Ethernet or other communications module can amplify and reinforce a signal received from a non-local source without requiring a transformer or other magnetic component. A semiconductor integrated difference amplifier circuit can be used to provide a high differential mode input impedance to amplify and reinforce a differential mode component of the received signal, while also providing a low common mode input impedance to attenuate a common mode component of the received signal. A transmission compensation network can generate a phase-shifted version of a locally transmitted signal being placed on the same communication terminals as the received signal during full duplex communications, for cancellation of such locally transmitted signal at inputs of a local receiver circuit. This can enhance detection of the received signal generated by the non-local source. Moreover, because the present circuit need not require a transformer or other magnetic component, it allows the possibility of being DC-coupled, which can help reduce or avoid baseline wander, such as when receiving communications from a non-local transceiver that also omits using a transformer or other magnetic component.

Figure 1:
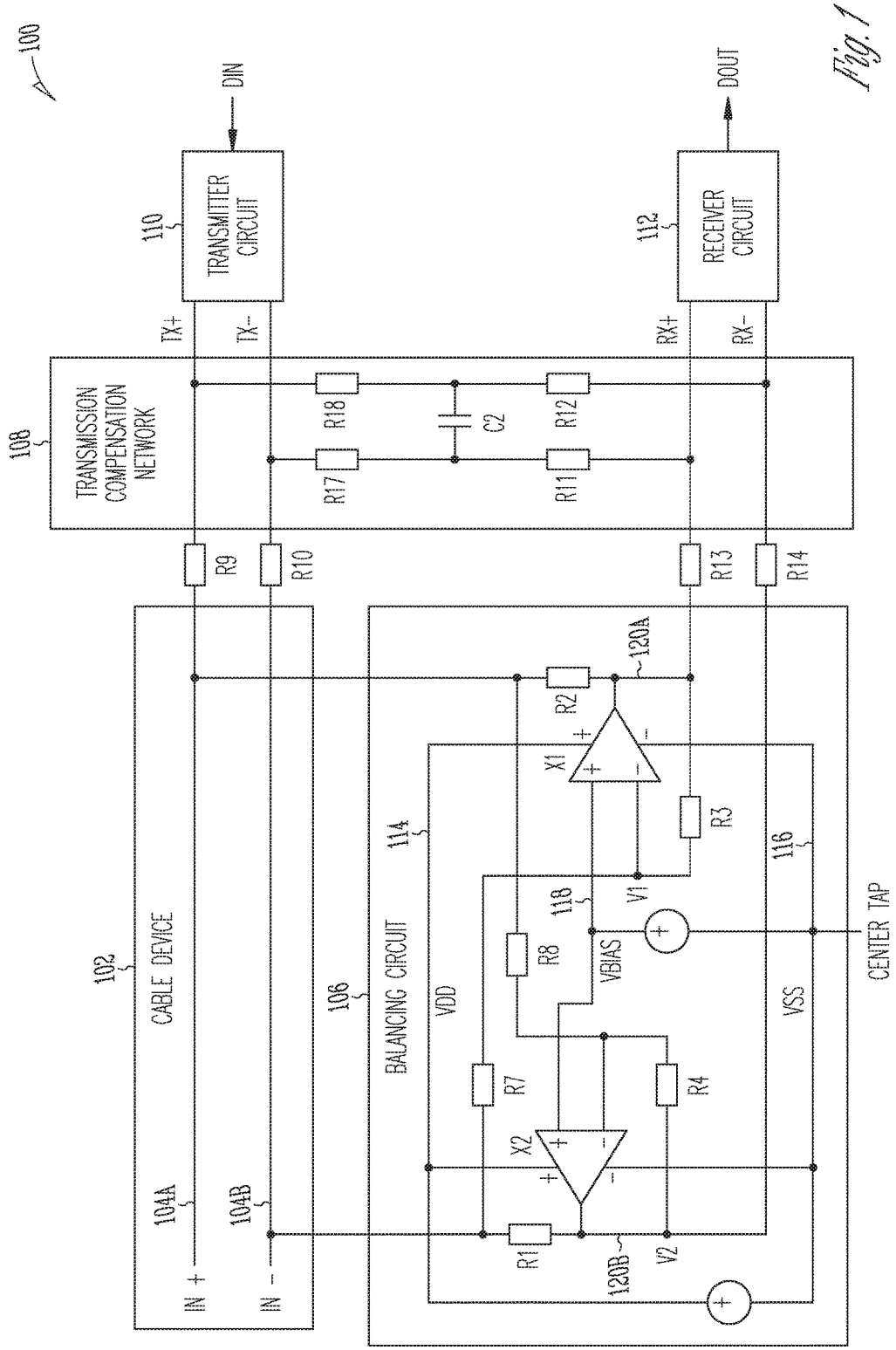
FIG. 1 shows an example of a transceiver circuit, such as can be used at an Ethernet or other network communications node.

FIG. 1 shows an example of a transceiver circuit 100, such as can be used at an Ethernet or other network communications node. The physical layer of the Ethernet or other communications medium can include a cable device 102 such as a twisted pair of wires or other pair of communication lines 102, which can be connected to positive and negative signal terminal connections IN+, IN− at input/output (I/O) nodes 104A-B. The transceiver circuit 100 can include a balancing circuit 106 (which need not require a magnetic component such as an autotransformer), a transmission compensation network 108, a local transmitter circuit 110, and a local receiver circuit 112. Termination resistors R9 and R10 can be located between the positive and negative signal connections IN+, IN− to the Ethernet cable communication lines 102, at respective nodes 104A-B, and the transmission compensation network 108. The termination resistors R9, R10 can be sized to provide a resistance value that provides a 100 ohm differential termination resistance to the communication lines 102, such as with R9, R10 being approximately 50 ohms each, in an example.

The transmitter circuit 110 can receive a data input signal DIN. In response, the transmitter circuit 110 can process DIN to generate corresponding electrical signals to drive the communication lines 102, such as via a path that can include the transmission compensation network 108 and the local positive and negative signal connections IN+ and IN− at nodes 104A-B to which such communication lines 102 can be connected.

The receiver circuit 112 can receive data via a differential signal from the communication lines 102, such as via a path that can include the balancing circuit 106 and the transmission compensation network 108. In response, the balancing circuit 106 can provide a high differential mode input impedance to amplify the differential signal from the communication lines 102 while providing a low common mode input impedance for attenuating any common mode signal for being provided to the receiver circuit 112, which, in turn, can process its input signal to provide a corresponding output signal such as the DOUT output signal representing the data received over the communication lines 102. The "high" differential mode input impedance and "low" common mode input impedance are defined in this document to be relative to each other, rather than in absolute or independently quantifiable impedance terms.

The transmission compensation network 108 can help compensate, attenuate, or cancel, at the inputs of the receiver circuit 112, a component of the signal on the communication lines 102 due to the transmission signal generated by the transmitter circuit 110. In this way, the signal at the inputs of the receiver circuit 112 can more accurately represent small-amplitude differential signal data being received on the communication lines 102 from an external source other than the transceiver circuit 100, without being conflated by larger-amplitude differential signal data being generated locally on the communication lines 102 by the transmitter circuit 110. The transmission compensation network 108 can accomplish this by providing a phase-shifted version of signal generated by the transmitter circuit 110 at the inputs to the receiver circuit 112, so that the transmission component of the signal on the communication lines 102 can be cancelled at the inputs of the receiver circuit 112.

The balancing circuit 106 (which can also be referred to as a difference signal sense amplifier circuit) can reinforce and amplify a small difference signal representing data on the communication lines 102, while attenuating a common-mode component of the signal on the communications lines 102, such as may be due to baseline wander of the common-mode component of the signal on the communications lines 102. This can be accomplished by the balancing circuit 106 providing a high input impedance for detected differential mode signals and a low input impedance for detected common mode signals. The balancing circuit 106 can be conceptualized and referred to as a "teeter-totter" or "see-saw" circuit in that it emphasizes and reinforces the differential signal at its inputs (which can be conceptualized as lever ends of the teeter-totter), while maintaining fixed or attenuating the common mode voltage (which can be conceptualized as the fulcrum of the teeter-totter).

The balancing circuit 106 can include or be coupled to a power supply voltage circuit V2, such as can provide a positive supply voltage rail VDD at node 114 and a negative power supply voltage rail VSS at node 116, which one or the other would otherwise be connected to a center tap of an autotransformer circuit, which magnetic component is not required and can be avoided using the balancing circuit 106. The balancing circuit 106 can include a first amplifier circuit X1 and a second amplifier circuit X2. The amplifier circuits X1 and X2 can include differential input, single-ended output operational amplifier circuits that can respectively include positive power supply inputs respectively coupled to the positive power supply voltage rail VDD at node 114 and negative power supply inputs respectively coupled to the negative power supply voltage rail VSS at node 116. The high input impedance non-inverting inputs of X1 and X2 can be coupled to a common-mode bias voltage VBIAS at node 118. The low-impedance outputs of the amplifiers X1 and X2 can be respectively coupled to nodes 120A, 120B. The bias voltage VBIAS at node 118 can be provided by a bias voltage generator circuit V1, which can be included in or coupled to the balancing circuit 106. The bias voltage VBIAS can be at a desired common mode voltage between the voltages supplied by the power supply rails VDD and VSS, such as at the input common mode voltage of the Analog to Digital Converter of the RX stage.

The balancing circuit can include a first input resistor, R8, such as can connect the positive signal connection IN+ at node 104A to the inverting input of the amplifier X2, and a second input resistor, R7, such as can connect the negative signal connection IN− at node 104B to the inverting input of the amplifier X1. A first shunt resistor, R1, can connect the negative signal connection IN− at node 104B to the low impedance output of the amplifier X2. A second shunt resistor, R2, can connect the positive signal connection IN+ at node 104A to the low impedance output of the amplifier X1. For example, the shunt resistors R1, R2 can have like resistance values in the single ohms or tens of ohms. A first feedback resistor R3 can be connected between the inverting input of the amplifier X1 and the output of the amplifier X1. A second feedback resistor R4 can be connected between the inverting input of the amplifier X2 and the output of the amplifier X2. The input resistors R8, R7 and the feedback resistors R4, R3 form gain-setting resistors that set the closed-loop gain of the amplifiers X1 and X2 in the configuration as shown in FIG. 1. For example, the resistors R7, R8, R3, R4 can be equal-valued in the hundreds of ohms and can provide a closed-loop gain setting of between 1 and 3 for the amplifiers X1 and X2.

In operation, applying a small positive differential voltage at IN+ (with respect to the voltage at IN−) will be presented at the inverting input of the amplifier X2 via the resistor R8, which will cause a decrease in the voltage at the output of the amplifier X2, which will not only decrease the voltage at the RX− input of the receiver circuit 112, via the resistor R14, but will also pull down the voltage at IN− via a pulldown current through the resistor R1. Conversely, applying a small positive differential voltage at IN− (with respect to the voltage at IN+) will be presented at the inverting input of the amplifier X1 via the resistor R7, which will cause a decrease in the voltage at the output of the amplifier X1, which will not only decrease the voltage at the RX+ input of the receiver circuit 112, via the resistor R13, but will also pull down the voltage at IN+ via a pulldown current through the resistor R2. To recap, the differential mode input signal is amplified with a high input impedance relative to the input impedance as seen by a common mode input signal.

In operation, increasing the common mode voltage at both IN+ and IN− will cause the outputs of both of the amplifiers X1 and X2 to go negative, which will increase the pulldown current through each of R1 and R2 to pull the common mode voltage at both IN+ and IN− in a negative direction, thereby providing a common mode low relative input impedance negative feedback configuration which rejects the common-mode voltage and tends to return it toward its desired value. To recap, the common mode input signal is rejected using the low output impedance of the amplifiers X1 and X2.

The transmission compensation network 108 can receive the transmitted signal at the outputs of the transmitter circuit 110, at TX+, TX−, and present a 180 degree phase-shifted version of that transmitted signal at the inputs of the receiver circuit 112, at RX+, RX−. In this way, the transmitted signal that gets placed onto the communication lines 102 at IN+, IN−, can be subtractively cancelled by the transmission compensation network 108 at the inputs RX+, RX−, of the receiver circuit 112, to enhance detection of the signal received over the Ethernet cable communication lines 102 at IN+, IN−, such as by avoiding the signal to be detected and received being swamped by the signal being transmitted.

The transmission compensation network 108 can include resistors R17, R18, R11, R12. The resistors R17 and R11 can be connected in series between the TX-output of the transmitter circuit 110 and the RX+ input of the receiver circuit 112. The resistors R18 and R12 can be connected in series between the TX+ output of the transmitter circuit and the RX− input of the receiver circuit 112. A capacitor C2 can be connected between (1) the intermediate node between R17 and R11 and (2) the intermediate node between R18 and R12, such as to create an H-bridge configuration with the resistors R17, R18, R11, R12 and C2. The values of these resistors and capacitor can be selected to provide the desired 180 degree phase shift at the specified data transmission frequency of the transmitter circuit 110. For example, at the specified 125 MHz Ethernet transmission frequency, the resistors R17, R18, R11, R12 can have a resistance value of a few hundred ohms to a few kiloohms, and the resistor C2 can have a capacitance value of a few picoFarads. Other component values are also possible.

Figure 2:
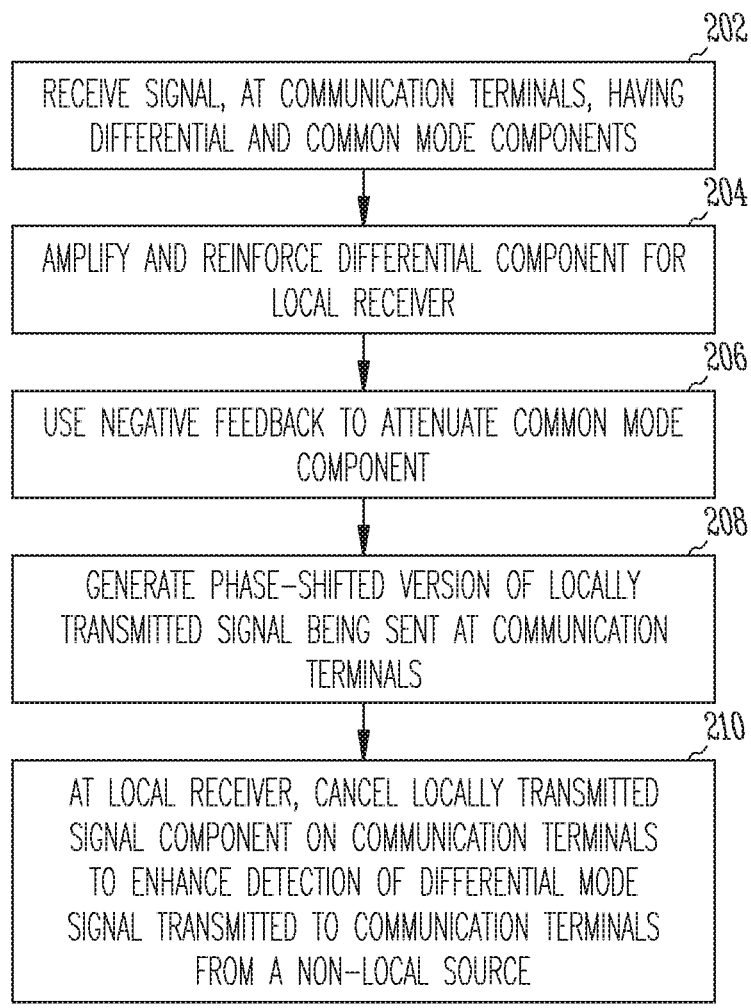
FIG. 2 shows an example of a method of using a transceiver circuit, such as for Ethernet communications without requiring a transformer or other magnetic component.

FIG. 2 shows an example of a method 200 of using a communication transceiver, such as that shown in FIG. 1, such as for Ethernet or other wired communication.

At 202, a signal can be received at communication terminals 104A-B. The received signal can have a differential mode component and a common mode component.

At 204, high differential mode relative input impedance can be used to amplify and reinforce the differential mode component of the received signal, such as for presentation to a local receiver circuit 112.

At 206, low common mode relative input impedance can be used to attenuate the common mode component of the received signal, such as to enhance detection of the differential mode component of the received signal by the local receiver circuit 112, or to help avoid saturation of the local receiver circuit 112.

At 208, a phase-shifted version of a locally transmitted signal (e.g., generated by a local transmitter circuit 110 for sending at the communication terminals 104A-B) can be generated, such as by a transmission compensation network 108.

At 210, the phase-shifted version of the locally transmitted signal can be applied at the inputs of the local receiver circuit 112, such as to enhance detection of the differential mode signal transmitted to the communication terminals 104A-B by a non-local source by cancelling the locally transmitted signal that can also be present at the communications terminals 104A-B during full duplex communications.

Although the balancing circuit (also referred to as a sense amplifier circuit) has been shown in a particular application for use in a communications transceiver circuit such as an Ethernet communication module that need not require a transformer or other magnetic component, it should be understood that the balancing circuit can be used in a variety of other communications or other circuit applications, and is not to be limited by the particular application in which it is shown in FIG. 1.

In one approach using a transformer, a center tap (CT) of the transformer can be used to carry common mode currents to a termination to an earth potential in order to damp high frequency noise of the Ethernet or other cable, or to provide a path for electrostatic discharge (ESD) currents. In the present approach, which does not require using a transformer, the node 116 labeled "Center Tap" in FIG. 1 can be used in a similar fashion to obtain a similar functional benefits.

Additional Notes

The above description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A circuit, comprising:
   first and second I/O connection terminals; and
   a semiconductor integrated difference signal sense amplifier circuit having inputs respectively coupled to the first and second I/O connection terminals, and sense amplifier circuit outputs, the semiconductor integrated difference signal sense amplifier circuit including first and second amplifiers configured to include:
      a differential mode high relative input impedance to actively amplify and reinforce a differential signal received at the communication connection terminals without requiring a transformer or other magnetic component; and
      a common mode low relative input impedance to actively pull the common mode signal voltage at the first and second I/O connection terminals toward a desired value, wherein the common mode relative low input impedance is low relative to the differential mode high relative input impedance.

2. The circuit of claim 1, included in a communications transceiver circuit further comprising:
   a receiver circuit, including receiver circuit inputs coupled to the sense amplifier circuit outputs;
   a transmitter circuit, including transmitter circuit outputs respectively coupled to the first and second I/O connection terminals; and
   a transmission compensation network, coupled to the transmitter circuit and the receiver circuit, and configured to phase shift a transmitted signal at the transmitter circuit outputs for presentation at the receiver circuit inputs of the receiver circuit to attenuate or remove the transmitted signal at the receiver circuit inputs of the receiver circuit.

3. The circuit of claim 2, wherein the semiconductor integrated difference signal sense amplifier circuit includes:
   a first amplifier circuit including a non-inverting input biased at a specified signal value, an inverting input coupled to the second I/O connection terminal, and an output coupled to a non-inverting input of the receiver circuit and to the first I/O connection terminal; and
   a second amplifier circuit including a non-inverting input biased at the specified signal value, an inverting input coupled to the first I/O connection terminal, and an output coupled to the inverting input of the receiver circuit and to the second I/O connection terminal.

4. The circuit of claim 3, wherein the transmission compensation network includes:
   first and second resistors in series with each other between an inverting output of the transmitter circuit and a non-inverting input of the receiver circuit;
   third and fourth resistors in series with each other between a non-inverting output of the transmitter circuit and an inverting input of the receiver circuit; and
   a capacitor having a first terminal connected to a node between the first and second resistors and having a second terminal connected to a node between the third and fourth resistors.

5. The circuit of claim 4, wherein the resistance values of the first, second, third, and fourth resistors and the capacitance value of the capacitor are selected to provide a nominal 180 degree phase shift at a specified data transmission frequency of the transmitter circuit.

6. The circuit of claim 3, wherein the semiconductor integrated difference signal sense amplifier circuit includes:
   a first shunt resistor, between the output of the first amplifier circuit and the first I/O connection terminal; and
   a second shunt resistor, between the output of the second amplifier circuit and the second I/O connection terminal.

7. The circuit of claim 6, wherein the semiconductor integrated difference signal sense amplifier circuit includes:
   a first input resistor, coupling the inverting input of the first amplifier circuit to the second I/O connection terminal;
   a second input resistor, coupling the inverting input of the second amplifier circuit to the first I/O connection terminal;
   a first feedback resistor, coupling the output of the first amplifier circuit to the inverting input of the first amplifier; and
   a second feedback resistor, coupling the output of the second amplifier circuit to the inverting input of the second amplifier.

8. The circuit of claim 2, further comprising:
   a first termination resistor, coupling the first I/O connection terminal to a non-inverting output of the transmitter circuit; and
   a second termination resistor, coupling the second I/O connection terminal to an inverting output of the transmitter circuit.

9. The circuit of claim 8, further comprising:
   a first decoupling resistor, coupled between the output of the first amplifier circuit and the non-inverting input of the receiver circuit; and
   a second decoupling resistor, coupled between the output of the second amplifier circuit and the inverting input of the receiver circuit.

10. A method of using a circuit, the method comprising:
    actively amplifying and reinforcing a differential signal using differential mode high relative input impedance of amplifiers of a semiconductor integrated difference signal amplifier circuit, and without requiring a transformer or other magnetic component, the differential signal received at first and second communication connection terminals; and actively pulling the common mode signal voltage at the first and second communication connection terminals toward a desired value using common mode low relative impedance of the amplifiers of the semiconductor integrated difference signal amplifier circuit, wherein the common mode relative low input impedance is low relative to the differential mode high relative input impedance.

11. The method of claim 10, further comprising:

phase-shifting a locally transmitted signal produced by a local transmitter circuit by 180 degrees at a specified data transmission frequency of the local transmitter circuit; and applying the phase-shifted locally transmitted signal to a local receiver circuit to attenuate or cancel the locally transmitted signal to enhance detection of a signal received at the first and second connection terminals from a non-local transmitter.

12. The method of claim 11, further comprising:

resistively decoupling the first and second amplifier outputs from the local receiver circuit.

13. The method of claim 10, comprising:

using a first amplifier of the amplifiers to sense a voltage increase at the second communication connection terminal and, in response, drive a voltage decrease at the first communication connection terminal; and using a second amplifier of the amplifiers to sense a voltage decrease at the first communication connection terminal and, in response, drive a voltage increase at the second communication connection terminal.

14. The method of claim 13, comprising:

using the first amplifier to sense a voltage decrease at the second connection terminal and, in response, drive a voltage increase at the first connection terminal; and using the second amplifier to sense a voltage increase at the first connection terminal and, in response, drive a voltage decrease at the second connection terminal.

15. The method of claim 10, comprising:

sensing a voltage increase at the second connection terminal using a first amplifier of the amplifiers together with sensing a voltage increase at the first connection terminal using a second amplifier of the amplifiers and, in response, using the first and second amplifiers to actively increase a shunt current away from the first and second connection terminals to actively decrease the voltage at the first and second connection terminals.

16. The method of claim 15, comprising:

sensing a voltage decrease at the second connection terminal using the first amplifier together with sensing a voltage decrease at the first connection terminal using the second amplifier and, in response, using the first and second amplifiers to actively decrease a shunt current away from the first and second connection terminals to actively increase the voltage at the first and second connection terminals.

17. The method of claim 15, wherein actively increasing a shunt current away from the first and second connection terminals includes using an output voltage of the first amplifier to drive a first shunt resistor between the output of the first amplifier and the first connection terminal and using an output voltage of the second amplifier to drive a second shunt resistor between the output of the second amplifier and the second connection terminal.

18. A communications transceiver circuit, comprising:

first and second communication connection terminals; and a semiconductor integrated difference signal sense amplifier circuit, having inputs respectively coupled to the first and second communication connection terminals, and sense amplifier circuit outputs, the sense amplifier circuit including first and second amplifiers configured to include:

a differential mode high relative input impedance to actively amplify and reinforce a differential signal received at the communication connection terminals without requiring a transformer or other magnetic component; and a common mode low relative input impedance to actively pull the common mode signal voltage at the first and second connection terminals toward a desired value, wherein the common mode relative low input impedance is low relative to the differential mode high relative input impedance;

a receiver circuit, including receiver circuit inputs coupled to the sense amplifier circuit outputs;

a transmitter circuit, including transmitter circuit outputs respectively coupled to the first and second communication connection terminals; and a transmission compensation network, coupled to the transmitter circuit and the receiver circuit, and configured to phase shift a transmitted signal at the transmitter circuit outputs for presentation at the receiver circuit inputs of the receiver circuit to attenuate or remove the transmitted signal at the receiver circuit inputs of the receiver circuit; and wherein the sense amplifier circuit includes:

a first amplifier circuit including a non-inverting input biased at a specified signal value, an inverting input coupled to the second communication connection terminal, and an output coupled to a non-inverting input of the receiver circuit and to the first communication connection terminal; and a second amplifier circuit including a non-inverting input biased at the specified signal value, an inverting input coupled to the first communication connection terminal, and an output coupled to the inverting input of the receiver circuit and to the second communication connection terminal.

19. The communications transceiver circuit of claim 18, wherein the sense amplifier circuit is configured for sensing a voltage increase at the second connection terminal using the first amplifier together with sensing a voltage increase at the first connection terminal using the second amplifier and, in response, using the first and second amplifiers to actively increase a shunt current away from the first and second connection terminals to actively decrease the voltage at the first and second connection terminals.

20. The communications transceiver circuit of claim 18, wherein the sense amplifier is configured for sensing a voltage decrease at the second connection terminal using the first amplifier together with sensing a voltage decrease at the first connection terminal using the second amplifier and, in response, using the first and second amplifiers to actively decrease a shunt current away from the first and second connection terminals to actively increase the voltage at the first and second connection terminals.

* * * * *